United States Patent
Scherr

(10) Patent No.: US 6,879,949 B2
(45) Date of Patent: Apr. 12, 2005

(54) CURRENT COUPLING FOR MIXED CIRCUIT SIMULATION

(75) Inventor: Wolfgang Scherr, Liebenfels (AT)

(73) Assignee: Infineon Technologies AG, Munich (DE)

( * ) Notice: Subject to any disclaimer, the term of this patent is extended or adjusted under 35 U.S.C. 154(b) by 214 days.

(21) Appl. No.: 09/948,262

(22) Filed: Sep. 6, 2001

(65) Prior Publication Data

US 2002/0049577 A1 Apr. 25, 2002

(30) Foreign Application Priority Data

Sep. 6, 2000 (DE) .......................................... 100 43 905

(51) Int. Cl.⁷ .............................................. G06F 17/50
(52) U.S. Cl. .................................. 703/14; 703/2; 716/4
(58) Field of Search ........................ 703/14, 16; 716/2, 716/4; 341/143, 131, 166

(56) References Cited

U.S. PATENT DOCUMENTS

| | | | | |
|---|---|---|---|---|
| 5,481,484 A | * | 1/1996 | Ogawa et al. .............. 364/578 |
| 5,859,605 A | * | 1/1999 | Raghavan et al. .......... 341/143 |
| 6,011,345 A | * | 1/2000 | Murray et al. .............. 310/321 |
| 6,163,286 A | * | 12/2000 | Lee et al. .................... 341/143 |
| 6,218,974 B1 | * | 4/2001 | Dedic .......................... 341/144 |
| 6,367,043 B1 | * | 4/2002 | Damarla ..................... 714/733 |
| 2002/0022951 A1 | * | 2/2002 | Heijningen et al. |
| 2002/0049576 A1 | * | 4/2002 | Meyer |
| 2003/0004700 A1 | * | 1/2003 | Scherr et al. |

* cited by examiner

Primary Examiner—Thai Phan
(74) Attorney, Agent, or Firm—Laurence A. Greenberg; Werner H. Stemer; Gregory L. Mayback

(57) ABSTRACT

Electronic circuits and systems which include digital and analog circuit sections are simulated with a combination of analog and digital simulation. For the interface matching of the two types of simulation, there is used, between a connection of an analog-simulated circuit element and a connection of a digitally simulated circuit element, a transport element for transporting current values between the circuit elements.

15 Claims, 1 Drawing Sheet

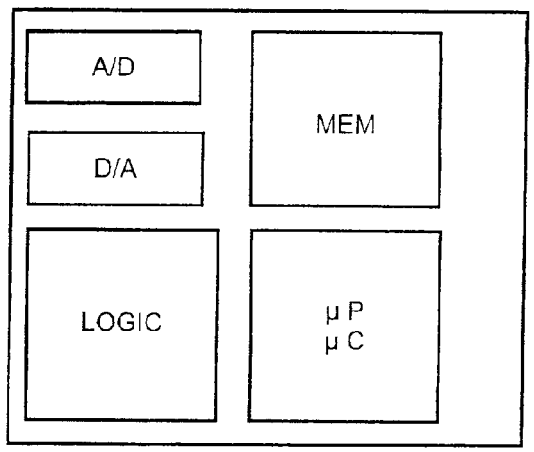
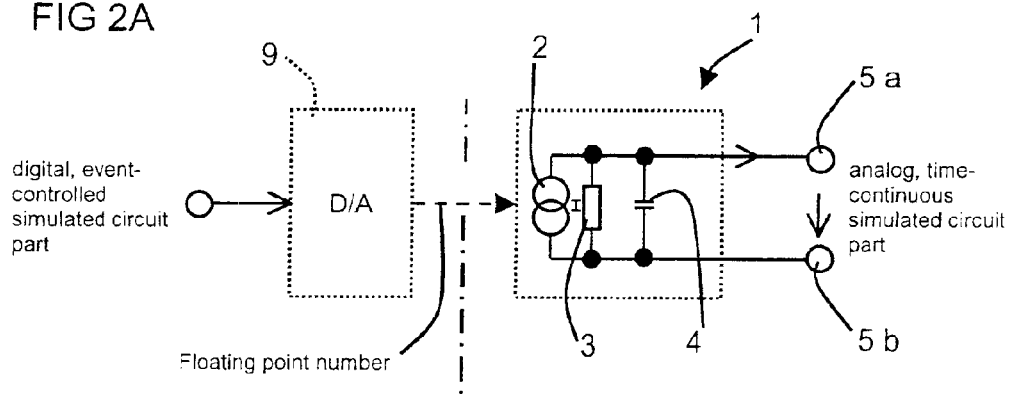
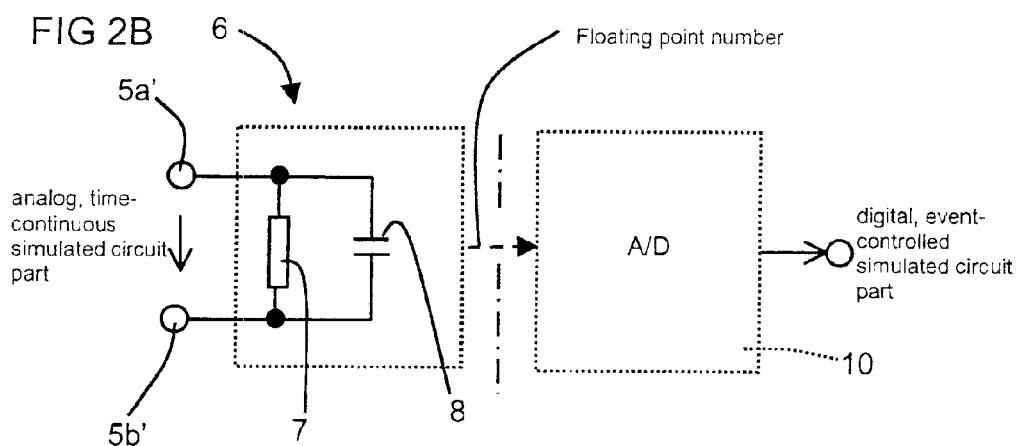

CURRENT COUPLING FOR MIXED CIRCUIT SIMULATION

BACKGROUND OF THE INVENTION

Field of the Invention

With the ever-increasing scale of integration and constantly rising complexity of the circuits, the proportion of the development and production times of electronic circuits made up by the circuit design is also constantly on the increase. For this reason, reducing the design times is an important object in the computer-aided development of circuits.

The computer-aided development of circuits proceeds from a conceptual circuit concept and comprises the steps of writing down the circuit concept in a suitable hardware description language (e.g. VHDL or SPICE) using models, the simulation of the modeled circuit, the synthesis of a circuit design (creation of a synthesized network list), the resimulation of the synthesized design (post-layout simulation), and the programming of a suitable chip production apparatus.

The entire process sequence is also referred to as "design flow". In the text below, we will consider exclusively the simulation step in the design flow.

Various methods for the simulation of electronic circuits are known, which differ with regard to the circuit description levels and simulation levels that are used. The circuit description levels may differ in their fineness and correspond to the simulation levels adapted to them. By using a plurality of circuit description levels during the modeling of a design, it is possible to significantly reduce the computation complexity for the circuit simulation.

The description of a circuit at the system level is effected by means of so-called HLL constructs, for example, IF . . . THEN . . . ELSE . . . This functional description is used to simulate functional relationships of the circuit model with discrete values for signals and time. The signals can be abstractly realized as variables. Examples of the system simulation are queues and computer communication.

The so-called register transfer simulation is carried out at the block level or register transfer level. The circuit is resolved into function blocks and the interaction of the blocks is simulated. The description is likewise effected by means of HLL constructs or by means of functional blocks, e.g. RAM, ALU, ROM. For the simulation, the functional description of the input/output behavior is created with discrete and predetermined time conditions.

The description of a circuit at the gate or logic level is effected, on the one hand, by means of functional blocks, for example, RAM, ROM, or, on the other hand, by means of gates, such as, for example, NAND, AND, OR, NOT. The logical description of these blocks or gates contains Boolean equations and delay times. The work is affected using discrete values (Boolean variables) and discrete states, e.g. 0, 1, X (X denotes an indeterminate state). The simulation of the time behavior of logic circuits is enabled by the assignment of delay times to gates.

The so-called switch level is particularly suitable for the handling of MOS circuits. The description of a circuit model at this level is effected by means of transistors as switches. For the transistors, only the states on, off and open input are taken into account. That corresponds to the discrete signal values 0, 1 and X at the nodes.

At the circuit or transistor level, the circuit is described by electrical devices (resistors, capacitors, transistors, . . . ) and their link connections. The behavior is described by means of time-dependent, continuous physical quantities such as e.g. current $I(t)$, voltage $U(t)$ and charge $Q(t)$. Different equivalent circuits (models) can be chosen for the devices (e.g. transistors), as a result of which it is possible to achieve different accuracies during the simulation.

During the simulation at the device level, exclusively individual devices such as e.g. transistors or diodes are considered. The mode of operation of the devices is represented by precise numerical models.

For the simulation of the circuit levels described, there are two fundamentally different simulation methods available, which are referred to as digital simulation and analog simulation.

The digital simulation essentially relates to the system, register transfer and logic level. With the aid of the digital simulation, the user can verify his logic design, i.e. check whether the circuit formulated in the hardware description language fulfils the desired logical circuit functions. The simulation is effected on the basis of event control, i.e. changes of output signals are (newly) calculated only in the case of those circuit elements at whose inputs a change in the input signals occurs during the transition from the previous event to the present event. The description of the circuit elements is effected, as already mentioned, mainly using the hardware description language VHDL.

The analog simulation likewise extends over a plurality of system levels (circuit and device level). Analog simulation is primarily understood to be the simulation at the circuit level. Just like in the case of the digital simulation, the user, with the aid of the analog simulation, can verify both the function of the circuit design, i.e. the correspondence of the logical circuit functions with the aid of predetermined Boolean functions, and the time behavior of the circuit design. In contrast to the digital simulation, however, in the case of the analog simulation, the signals are assigned from the outset continuous or very finely gradated discrete numerical values (floating point numbers). In this way, it is possible to represent analog signals (voltage, current) from which it is possible to read level values or edge steepnesses which are required for assessing the simulated devices (transistors, capacitors, inductors . . . ).

The simulation of complex overall circuits requires a mixed simulation. Different circuit sections are assigned to the circuit description levels and are simulated either in an analog or in a digital fashion depending on the circuit description level. The simultaneous analog and digital simulation is also referred to as "mixed-mode" simulation. In the case of mixed-mode simulation, the problem arises as to the way wherein simulation results which have been determined in the case of one type of simulation can be made available to the other type of simulation.

The transfer of signal information between the two types of modulation has hitherto been effected on the basis of voltage values. European publication EP 0 481 117 describes a method by which continuous voltage values which are obtained during the analog simulation can be converted into binary voltage input values for the digital simulation, or binary output voltage values of the digital simulation can be converted into continuous voltage values for the analog simulation. In both cases, a coupling element inserted between an output (or input) of the analog-simulated circuit element and an input (or output) of the digitally simulated circuit element is used for the signal transformation. In the first case, the coupling element is realized by a comparator across whose input a load resistor is connected. The comparator evaluates an analog signal function and generates binary state transitions if the input signal strength exceeds or falls below defined comparator thresholds. In the second case, the coupling element arranged between an output of a digitally simulated circuit element and the input of an analog-simulated circuit element is modeled by a controllable voltage source with a controllable internal resistance. In this case, the voltage and the internal resistance of the controllable voltage source are produced from the digital voltage signal, the signal strength thereof, and also the user's specified technological parameters (signal amplitude, potential position, edge steepness).

In many cases, however, considering a coupling of analog-simulated and digitally simulated circuit sections solely on the basis of voltage signals is insufficient for the simulation of the overall circuit. This is the case in particular when the different circuit sections have a current coupling, i.e. their interaction and their function is dependent on the magnitude of the output and/or input currents. In order to circumvent these problems, it has hitherto been attempted to place the boundary line between the analog-simulated circuit sections and the digitally simulated circuit sections in such a way that the boundary line separates circuit sections with the least possible current coupling.

SUMMARY OF THE INVENTION

It is accordingly an object of the invention to provide a circuit and system simulation method and a corresponding computer-readable program, which overcomes the above-mentioned disadvantages of the heretofore-known devices and methods of this general type and which further improves the mixed-mode simulation in the presence of current-coupled analog-simulated and/or digitally simulated circuit sections.

With the foregoing and other objects in view there is provided, in accordance with the invention, a method of simulating electronic circuits and systems having digital and analog circuit sections, the method which comprises:

simulating an analog circuit section with analog simulation;

simulating a digital circuit section with digital simulation;

interface matching between the analog and digital simulation by establishing between a connection of the analog-simulated circuit element and a connection of the digitally simulated circuit element a transport element for transporting current values between the circuit elements.

In accordance with an added feature of the invention, the transport element is established between outputs of the digitally simulated circuit element and inputs of an analog-simulated circuit element, and the transport element is modeled as a current source feeding a parallel circuit comprising a first resistor and a first capacitor.

In accordance with an additional feature of the invention, the transport element is established between outputs of an analog-simulated circuit element and an input of a digitally simulated circuit element, and the transport element is modeled as a current sink comprising a parallel circuit formed by a second resistor and a second capacitor.

In accordance with another feature of the invention, for the simulation, user-defined values are read in for the parameters current intensity, resistance, and capacitance of the transport element. Preferably, the parameters are technology-dependent parameters.

In accordance with a further feature of the invention, the transport element is modeled with an ideal current source having the first resistor with an infinite resistance value and the first capacitor with a capacitance value of zero or, as an ideal current sink having a second resistor with a zero resistance value and a second capacitor with a zero capacitance value.

In accordance with again a further feature of the invention, in the model a quasi-ideal current sink may be chosen with a small resistance R2 relative to an internal resistance of the modeled analog circuit element; and calculating a current value I with the equation I=U/R2, where U is a voltage value calculated across the current sink during the analog simulation.

With the above and other objects in view there is also provided in accordance with the invention, a computer program product adapted to be loaded into an internal memory of a computer. The program product comprises computer program code sections written in hardware description language and relating to analog simulation of circuit sections and to digital simulation of circuit sections, and a code section for a definition of a model for a current transport element between connections of the simulated circuit sections. There is also provided a corresponding computer-readable medium containing a computer program for performing the above-outlined method.

The effect achieved by the means for transporting current values between analog-simulated and digitally simulated circuit elements is that circuit functions which are influenced by the presence or the size of the currents transported between the circuit elements can be taken into account both during the analog simulation and during the digital simulation. This extends the interface matching between analog and digital simulation to the transport of currents.

Preferably, the means, between an output of a digitally simulated circuit element and inputs of an analog-simulated circuit element, is modeled as a current source feeding a parallel circuit comprising a first resistor and a first capacitor. In this case, the current generated by the current source is directly prescribed by the current value calculated in the digitally simulated circuit element.

With regard to the interface matching in the opposite direction, an advantageous method measure is wherein the means, between outputs of an analog-simulated circuit element and an input of a digitally simulated circuit element, is modeled as a current sink comprising a parallel circuit formed by a second resistor and a second capacitor.

Other features which are considered as characteristic for the invention are set forth in the appended claims.

Although the invention is illustrated and described herein as embodied in a Current coupling during the mixed simulation of circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a complex electrical circuit composed of different circuit sections;

FIG. 2A is an equivalent circuit diagram of a coupling element for the interface matching between an output of a digitally simulated circuit element and an input of an analog-simulated circuit element; and FIG. 2B is an equivalent circuit diagram of a coupling element for the interface matching between an output of an analog-simulated circuit element and an input of a digitally simulated circuit element.

DESCRIPTION OF THE PREFERRED EMBODIMENTS

Referring now to the figures of the drawing in detail and first, particularly, to FIG. 1 thereof, there is shown an illustration of an electrical circuit which is realized in particular as an integrated circuit (IC). The electrical circuit comprises an analog-to-digital (A/D) converter, a digital-to-analog (D/A) converter, a logic unit, a memory (MEM), as well as a microprocessor up or microcontroller $\mu C$.

During the design of a circuit of this type, the different circuit sections are firstly coded in a suitable hardware description language and subsequently simulated in order to check the coded circuit design. By way of example, the VHDL (very high speed integrated circuits hardware description language) hardware description language can be used for coding the logic and memory modules. The description of the microprocessor or of the microcontroller is effected at the device level using models (C code routines) which are provided for the simulation by means of an analog simulator, for example, a simulator similar to a SPICE (simulation program with integrated circuit emphasis).

A/D converters and D/A converters can be described both in VHDL and in SPICE models.

For the result-controlled simulation of a specific circuit element (which is a component part of that circuit section of the overall circuit which is to be digitally simulated), the following program inputs for VHDL are required:

the VHDL program code for the circuit element;
a listing of the inputs of the circuit element;
a listing of the outputs of the circuit element; and
the element data.

The element data specify what physical quantities are taken into account during the simulation of the circuit element and in what representation these physical quantities are handled during the simulation. With regard to the representation of the physical quantities (i.e. the value range of the signal values), a distinction is made between types and subtypes. Available types include, inter alia, the Boolean values (0,1), integer values (−2147483648, . . . , 2147483647), so-called enumeration types ('0', '1', 'X', 'H', 'L', 'W', 'U', 'Z'), and floating point numerical values (−1.0E308, . . . , 1.0E308). Subtypes are used for the targeted restriction of the value set of types. Subtypes may be, for example, integer values in a range from 0 to 1024, the most important enumeration types ('0', '1', 'X') or specific floating point number intervals.

Types and subtypes can be assigned to different physical quantities (signals). Examples thereof include voltage and current, but also mechanical quantities such as pressure or force and thermal quantities such as for instance the heat flow. During the simulation of the circuit, only the types and subtypes that are deemed necessary are taken into account, in order to keep the simulation complexity as low as at all possible. For the specification of the signals occurring at the inputs and outputs of the circuit element, for example, the specification of a digital voltage value (0 or 1) suffices in many cases.

The digital simulation is carried out in such a way that firstly the list of inputs and outputs (so-called network lists) of the circuit element to be simulated and also the element data (types, subtypes) are read in and the simulation is subsequently performed on the basis of the circuit code in conjunction with the processing of a so-called event list. Event denotes a specific, predetermined occupancy of the input connections. All the events to be examined in the context of the simulation are listed in the event list. During the simulation, firstly the first event is read from the event list and the input connections of the circuit element are correspondingly occupied. The circuit element is simulated on the basis of its hardware circuit code and the values of the output connections are examined. If one or more signal values of the output connections have changed, a simulation of the circuit elements connected to the changed output connections is carried out. Further consequential events are taken into account in the same way. Once all the consequential events have been determined and recorded with regard to the simulated circuit section (i.e. the circuit elements encompassed by the said circuit section), the "reaction" of the simulated circuit section to the event underlying this simulation cycle is known. The simulation is then continued by reading the next event from the event list and using it as a basis for a subsequent simulation cycle.

The digital simulation is ended when the last event from the event list is processed.

The implementation of the analog simulation at the circuit level is explained below. For the description of the electrical behavior of a circuit element at the circuit level, the following program inputs are required:

a list describing the different circuit elements and their interconnections;
a set of models, each model describing a circuit element; and
specifications concerning the type of analysis which is to be carried out for the relevant circuit section.

In this case, each circuit element is realized as a system of two-terminal elements (resistors, capacitors, inductors, independent voltage and current sources, voltage-controlled and current-controlled voltage and current sources). The individual two-terminal elements are modeled by means of so-called characteristic equations for the edge voltages or edge currents assigned to the elements. More complex circuit elements such as MOSFETs, for example, can be represented by equivalent circuits comprising a plurality of two-terminal elements. The interlinking of the two-terminal elements of a circuit is represented as a coupling of the corresponding characteristic equations by means of Kirchhoff's two laws for the edge voltages and the edge currents. This system of coupled differential equations is solved numerically at discrete points in time (transient analysis). In order to carry out the analog simulation, it is possible to use either an event control (only the element functions of those circuit elements at whose inputs a change in the input signals occurs are calculated) or a control wherein a calculation of all the element functions (i.e. a calculation of the complete model) is performed at each point in time considered and/or each time the inputs are supplied with a new data record.

For their coupling, the analog simulation and digital simulation have differences with regard to the handling of signal values at the inputs and outputs of the respective circuit elements and with regard to the time handling of the signal values. Regarding the different time handling, either the continuous time handling of the analog simulation has to be matched to the discrete time handling of the digital simulation or the discrete time handling of the digital simulation has to be matched to the continuous time handling during the analog simulation.

The text below describes the reciprocal matching of the digital simulation and analog simulation with regard to the novel transmission of a signal value for the physical quantity current according to the invention.

For the interface matching between digitally simulated and analog-simulated circuit sections, provision is made, as already mentioned, of coupling elements which perform a current signal transformation between the digitally simulated and the analog-simulated circuit sections. In this case, each connection between the analog-simulated circuit section and the digitally simulated circuit section is handled and converted separately.

Firstly, the current signal transformation of a current value from a digitally simulated circuit element to an analog-simulated circuit element is described with reference to FIG. 2A.

In a first step, the coupling element used for the signal transformation is defined. The definition is effected on the basis of two-terminal elements, as is used for the hardware description of the analog-simulated circuit sections. The D/A coupling element 1 comprises a current-controlled current source 2, to whose output connections a nonreactive resistor 3 having the resistance R1 and a capacitor 4 having the capacitance C1 are connected. The two connections 5a and 5b represent the two terminals of this two-terminal element. As will be described in more detail below, the current-controlled current source 2 is controlled directly by a simulation result (current value) which is calculated in the context of the digital simulation. The resistance R1 and the capacitance C1 can be defined by the user and enable the digitally simulated circuit element's behavior "seen" from the analog-simulated circuit element to be modulated or interface-matched as if a realistic, non-modeled analog circuit were linked. The value ∞ is used as the initial value for the resistance R1 and the value 0 is used as the starting value for the capacitance. This means that the current source is an ideal current source.

For the interface matching in the opposite direction (from the analog-simulated circuit element to the digitally simulated circuit element), use is made of a two-terminal current sink 6, see FIG. 2B. On its input side, the current sink 6 has two connections 5a', 5b', to which a second nonreactive resistor 7 and also a second capacitor 8 are connected in a parallel circuit. The nonreactive resistance of the second resistor 7 is designated by R2 and the capacitance of the second capacitor 8 by C2.

The values for R2 and C2 can again be prescribed in a user-defined manner by the user. Analogously to the situation in the case of the signal transformation in the opposite direction, the values are chosen in such a way that the analog-simulated circuit element sees, at its outputs 5a' and 5b', a circuit characteristic which would in reality be generated by the digitally simulated circuit element. In the ideal case, the values R2 and C2 each have the value 0. The current value can then be tapped off directly at the coupling element 6. Since existing models only allow the tapping of voltage stages, it is possible to determine the current flowing through the current sink 6 by using a non-ideal current sink with a small resistance R2 (i.e. R2 is small relative to the internal resistance of the modeled circuit element) and to calculate it in accordance with Ohm's law I=U/R2 (where I denotes the current through the two-terminal element 6 and U denotes the voltage across the two connections 5a' and 5b').

The user-definability of the values R1, C1 and R2, C2 enables the user to choose these values in the form of technological parameters.

A second step relates to the modeling of the circuit description for the digital simulator. In this step, input and output connections are defined which are connected to the analog-simulated circuit element. These input and output connections are assigned the physical quantity current in the form of a subtype (as a floating point number). As a result, each digitally simulated circuit element which is to be connected via current coupling to an analog-simulated circuit element has an additional output connection and an additional input connection for a current signal (in the form of a floating point number). That (simulated) circuit section of the digitally simulated sub-circuit which is created by the addition of corresponding element data is illustrated by the reference symbols 9 (D/A interface) and 10 (A/D interface) in FIGS. 2A, 2B.

It is also possible to assign integer values in the digital domain to the additional output and input connections with the subtype declaration "current". The conversion (mapping) of the transmitted floating point numbers into integer values is then effected in the circuit sections 9 and 10, respectively. In order to obtain a sufficient resolution or accuracy in the digital domain, a small current value, for example, 1 nA, must be defined as the unit of the integer values in this case.

In a third step, the analog simulation and digital simulation are carried out simultaneously, the coupling that has hitherto merely taken voltage values into account now being extended to the coupling of currents. In this case, the current coupling between the two simulated circuit elements is controlled by the choice of suitable parameter values R1, R2, C1, C2. During the simulation of the overall circuit, current coupling effects of different coupling intensity can thus be taken into account, evaluated and utilized in a targeted manner during the later circuit synthesis.

The method according to the invention can be realized in the form of software (i.e. a computer program) which can be executed on a conventional computer. For this purpose, the following claims define a computer program product and, carrying the same, a computer-readable medium that includes, inter alia, floppy disks, hard disks, CDs, Flash ROMs, non-volatile ROM, RAM, as well as carrier waves used in data transmission. The software system comprises an analog and a digital simulator, as are commercially available for example through the programs SPICE and Verilog (VHDL). On the basis of these two simulation programs, the software product according to the invention furthermore comprises a matching routine which performs the interface matching between the analog and the digital simulator. The matching routine aids the user during the matching processes (steps 1, 2, and 3) to be performed with regard to the digital and the analog simulator, and also e.g. by providing an input option for the interface parameters R1, R2, C1, C2 with regard to all the current coupling points to be taken into account.

I claim:

1. A method of simulating electronic circuits and systems having digital and analog circuit sections, the method which comprises:

simulating an analog circuit section with analog simulation;

simulating a digital circuit section with digital simulation; and interface matching between the analog and digital simulation by simulating a transport of current values being sent via a transport element between a connection of the analog-simulated circuit element and a connection of the digitally simulated circuit element.

2. The method according to claim 1, which comprises establishing the transport element between outputs of the digitally simulated circuit element and inputs of an analog-simulated circuit element, and modeling the transport element as a current source feeding a parallel circuit comprising a first resistor and a first capacitor.

3. The method according to claim 2, which comprises establishing the transport element between outputs of an analog-simulated circuit element and an input of a digitally simulated circuit element, and modeling the transport element as a current sink comprising a parallel circuit formed by a second resistor and a second capacitor.

4. The method according to claim 3, which comprises modeling the transport element with an ideal current sink having a second resistor with a zero resistance value and a second capacitor with a zero capacitance value.

5. The method according to claim 3, which comprises choosing in the model a quasi-ideal current sink with a small resistance R2 relative to an internal resistance of the modeled analog circuit element; and calculating a current value I with the equation $I=U/R2$, where U is a voltage value calculated across the current sink during the analog simulation.

6. The method according to claim 2, which comprises modeling the transport element with an ideal current source having the first resistor with an infinite resistance value and the first capacitor with a capacitance value of zero.

7. The method according to claim 1, which comprises establishing the transport element between outputs of an analog-simulated circuit element and an input of a digitally simulated circuit element, and modeling the transport element as a current sink comprising a parallel circuit formed by a resistor and a capacitor.

8. The method according to claim 1, which comprises, for the simulation, reading in user-defined values for parameters current intensity, resistance, and capacitance of the transport element.

9. The method according to claim 8, which comprises reading in technology-dependent parameters.

10. A computer-readable medium containing a computer program for performing the method according to claim 1.

11. A computer program product adapted to be loaded into an internal memory of a computer, the program comprising computer program code sections written in hardware description language and relating to analog simulation of circuit sections and to digital simulation of circuit sections, and a code section for a definition of a model for simulating current values being sent via a current transport element between connections of the simulated circuit sections.

12. The computer program product according to claim 11, wherein the definition of the current transport element is a parameterization.

13. The computer program product according to claim 11, wherein the definition of the model is comprised of parameters current intensity, resistance, and capacitance with values characterizing an ideal current source.

14. The computer program product according to claim 11, wherein the definition of the model is comprised of parameters current intensity, resistance, and capacitance with values characterizing an ideal current sink.

15. A computer readable medium having computer program code embodied therein for causing at least one electronic computer system to provide information on a current coupling model for adjusting an interface between an analog-simulated circuit section and a digitally-simulated circuit section, said computer program code comprising:

program code configured to cause a computer to simulate at least one input and/or output terminal with a variable current in the digitally-simulated circuit section;

program code configured to cause a computer to define at least one coupling element in the analog-simulated circuit section simulating at least one of a current source controlled by a current value computed by a digital simulation and a current sink supplying the current value required for the input terminal of the variable current in the digitally simulated circuit section; and program code configured to cause a computer to perform the analog and digital simulation.

* * * * *